US009570398B2

(12) United States Patent
Chang et al.

(10) Patent No.: US 9,570,398 B2
(45) Date of Patent: Feb. 14, 2017

(54) CHIP PACKAGE AND METHOD FOR FORMING THE SAME

(71) Applicant: XINTEC INC., Jhongli, Taoyuan County (TW)

(72) Inventors: Shu-Ming Chang, New Taipei (TW); Yu-Ting Huang, Tainan (TW); Tsang-Yu Liu, Zhubei (TW); Yen-Shih Ho, Kaohsiung (TW)

(73) Assignee: XINTEC INC., Taoyuan (TW)

( * ) Notice: Subject to any disclaimer, the term of this patent is extended or adjusted under 35 U.S.C. 154(b) by 312 days.

(21) Appl. No.: 13/895,219

(22) Filed: May 15, 2013

(65) Prior Publication Data

US 2013/0307161 A1   Nov. 21, 2013

Related U.S. Application Data

(60) Provisional application No. 61/649,185, filed on May 18, 2012.

(51) Int. Cl.
*H01L 23/538* (2006.01)
*H01L 21/78* (2006.01)
(Continued)

(52) U.S. Cl.
CPC .......... *H01L 23/5384* (2013.01); *B81B 7/007* (2013.01); *H01L 21/78* (2013.01); *H01L 23/481* (2013.01);
(Continued)

(58) Field of Classification Search
CPC ............... H01L 23/5384; H01L 23/481; H01L 2924/1461; H01L 2224/94; H01L 2224/02371; B81B 7/007
(Continued)

(56) References Cited

U.S. PATENT DOCUMENTS 9,334,158 B2 * 5/2016 Huang ................... B81B 7/0077
2006/0175707 A1 * 8/2006 Lee ....................... B81C 1/00301
257/767
(Continued)

FOREIGN PATENT DOCUMENTS

TW   201101471   1/2011
TW   201108361   3/2011
TW   201133809   10/2011

OTHER PUBLICATIONS

"Silicon Sacrificial Layer Dry Etching (SSLDE) for free-standing RF MEMS architectures", 2003 IEEE.*
(Continued)

*Primary Examiner* — Eva Y Montalvo
*Assistant Examiner* — Nga Doan
(74) *Attorney, Agent, or Firm* — Liu & Liu

(57) ABSTRACT

An embodiment of the invention provides a chip package which includes: a first substrate; a second substrate disposed thereon, wherein the second substrate includes a lower semiconductor layer, an upper semiconductor layer, and an insulating layer therebetween, and a portion of the lower semiconductor layer electrically contacts with at least one pad on the first substrate; a conducting layer disposed on the upper semiconductor layer of the second substrate and electrically connected to the portion of the lower semiconductor layer electrically contacting with the at least one pad; an opening extending from the upper semiconductor layer towards the lower semiconductor layer and extending into the lower semiconductor layer; and a protection layer disposed on the upper semiconductor layer and the conducting layer, wherein the protection layer extends onto a portion of a sidewall of the opening, and does not cover the lower semiconductor layer in the opening.

20 Claims, 8 Drawing Sheets

(51) Int. Cl.
*H01L 23/48* (2006.01)
*B81B 7/00* (2006.01)
*H01L 23/00* (2006.01)
*H01L 21/683* (2006.01)
*H01L 23/60* (2006.01)

(52) U.S. Cl.
CPC .......... *H01L 24/92* (2013.01); *B81B 2207/095* (2013.01); *B81B 2207/096* (2013.01); *H01L 21/6835* (2013.01); *H01L 23/60* (2013.01); *H01L 24/02* (2013.01); *H01L 24/03* (2013.01); *H01L 24/05* (2013.01); *H01L 24/08* (2013.01); *H01L 24/11* (2013.01); *H01L 24/13* (2013.01); *H01L 24/29* (2013.01); *H01L 24/32* (2013.01); *H01L 24/80* (2013.01); *H01L 24/83* (2013.01); *H01L 24/94* (2013.01); *H01L 2221/68327* (2013.01); *H01L 2221/68381* (2013.01); *H01L 2224/02331* (2013.01); *H01L 2224/02371* (2013.01); *H01L 2224/03002* (2013.01); *H01L 2224/0401* (2013.01); *H01L 2224/05548* (2013.01); *H01L 2224/05617* (2013.01); *H01L 2224/05624* (2013.01); *H01L 2224/08147* (2013.01); *H01L 2224/08148* (2013.01); *H01L 2224/131* (2013.01); *H01L 2224/13021* (2013.01); *H01L 2224/13024* (2013.01); *H01L 2224/2919* (2013.01); *H01L 2224/32225* (2013.01); *H01L 2224/8385* (2013.01); *H01L 2224/92* (2013.01); *H01L 2224/94* (2013.01); *H01L 2924/10155* (2013.01); *H01L 2924/1306* (2013.01); *H01L 2924/13091* (2013.01); *H01L 2924/1461* (2013.01)

(58) Field of Classification Search
USPC .......................................................... 257/774
See application file for complete search history.

(56) References Cited

U.S. PATENT DOCUMENTS

| 2008/0099862 | A1* | 5/2008 | Fujii | B81C 1/00269 257/417 |
| 2012/0168939 | A1* | 7/2012 | Chang | B81C 1/00238 257/737 |
| 2012/0286420 | A1* | 11/2012 | Liu | B81B 7/007 257/737 |
| 2013/0168784 | A1* | 7/2013 | Lee | B81B 7/007 257/415 |

OTHER PUBLICATIONS

"Post-CMOS Process for High-AspectRatio Monolithically Integrated Single Crystal Silicon Microstructures", 2005 IEEE.*

* cited by examiner

CHIP PACKAGE AND METHOD FOR FORMING THE SAME

CROSS REFERENCE TO RELATED APPLICATIONS

This application claims the benefit of U.S. Provisional Application No. 61/649,185, filed on May 18, 2012, the entirety of which is incorporated by reference herein.

BACKGROUND OF THE INVENTION

Field of the Invention

The present invention relates to a chip package, and in particular, relates to a multi-chip package.

Description of the Related Art

Along with the trend towards lighter, thinner, shorter, and smaller electronic devices, current semiconductor chip package structures tend to be high performance, multi-functional multi-chip package (MCP) structures. Multi-chip package (MCP) structures integrate a variety of semiconductor chips, such as logic chips, analog chips, control chips, memory chips, or micro-electro mechanical system (MEMS) chips, in a single package.

Improved multi-chip package technology is required.

BRIEF SUMMARY OF THE INVENTION

An embodiment of the invention provides a chip package, which includes: a first substrate; a second substrate disposed on the first substrate, wherein the second substrate comprises a lower semiconductor layer, an upper semiconductor layer, and an insulating layer therebetween, and a portion of the lower semiconductor layer electrically contacts with at least one pad on the first substrate; a conducting layer disposed on the upper semiconductor layer of the second substrate and electrically connected to the portion of the lower semiconductor layer electrically contacting with the at least one pad; an opening extending from the upper semiconductor layer towards the lower semiconductor layer and extending into the lower semiconductor layer; and a protection layer disposed on the upper semiconductor layer and the conducting layer, wherein the protection layer extends onto a portion of a sidewall of the opening, and does not cover the lower semiconductor layer in the opening.

An embodiment of the invention provides a method for forming a chip package, which includes: providing a first substrate; providing a second substrate including a lower semiconductor layer, an upper semiconductor layer, and an insulating layer therebetween; bonding the second substrate onto the first substrate such that a portion of the lower semiconductor layer electrically contacts with at least one pad on the first substrate; removing a portion of the upper semiconductor layer and a portion of the insulating layer to form an opening exposing an upper surface of the lower semiconductor layer; forming a conducting layer on the upper semiconductor layer of the second substrate, wherein the conducting layer is electrically connected to the portion of the lower semiconductor layer electrically contacting with the at least one pad; forming a protection layer on the upper semiconductor layer and the conducting layer, wherein the protection layer extends onto a sidewall of the opening, and does not cover a portion of the upper surface of the lower semiconductor layer in the opening; and removing a portion of the lower semiconductor layer from the upper surface of the lower semiconductor layer in the opening by using the protection layer as a mask, and thus the opening extends into the lower semiconductor layer.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The manufacturing method and method for use of the embodiment of the invention are illustrated in detail as followed. It should be appreciated, however, that the present invention provides many applicable inventive concepts that can be embodied in a wide variety of specific contexts. The specific embodiments discussed are merely illustrative of specific ways to make and use the invention, and do not limit the scope of the invention. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first material layer "on," or "overlying" a second material layer, include embodiments where the first and second material layers are in direct contact and those where one or more material layers are interposing the first and second material layers.

A chip package according to an embodiment of the present invention may be used to package various chips. For example, the chip package of the embodiments of the invention may be applied to active or passive devices, or electronic components with digital or analog circuits, such as opto electronic devices, micro electro mechanical systems (MEMS), micro fluidic systems, and physical sensors for detecting heat, light, or pressure. Particularly, a wafer scale package (WSP) process may be applied to package semiconductor chips, such as image sensor devices, light-emitting diodes (LEDs), solar cells, RF circuits, accelerators, gyroscopes, micro actuators, surface acoustic wave devices, pressure sensors, ink printer heads, or power metal oxide semiconductor field effect transistor (MOSFET) modules.

The wafer scale package process mentioned above mainly means that after the package process is accomplished during the wafer stage, the wafer with chips is cut to obtain separate independent packages. However, in a specific embodiment, separate independent chips may be redistributed overlying a supporting wafer and then be packaged, which may also be referred to as a wafer scale package process. In addition, the above mentioned wafer scale package process may also be adapted to form chip packages of multi-layer integrated circuit devices by stacking a plurality of wafers having integrated circuits. In one embodiment, after the dicing process is performed, the obtained chip package is a chip scale package (CSP). The size of the chip scale package (CSP) may be only slightly larger than the size of the packaged chip. For example, the size of the chip scale package is not larger than 120% of the size of the packaged chip.

Figure 1A:
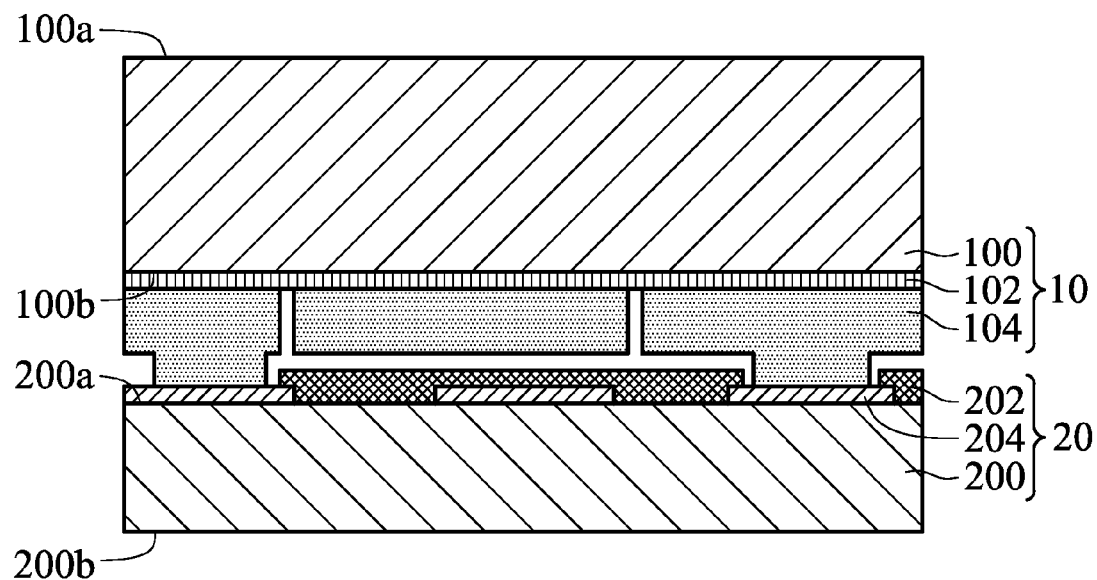
FIGS. 1A-1K are cross-sectional views of a manufacturing process of a chip package according to an embodiment of the present invention.

FIGS. 1A-1K are cross-sectional views of a manufacturing process of a chip package according to an embodiment of the present invention. As shown in FIG. 1A, substrates 10 and 20 are provided. In one embodiment, the substrates 10 and 20 are both semiconductor wafers, wherein the semiconductor wafers are, for example, but are not limited to a wafer with micro-electro mechanical systems (MEMS) and a wafer with complementary metal-oxide-semiconductor field effect transistors.

In one embodiment, the substrate 10 includes a lower semiconductor layer 104, an upper semiconductor layer 100 and an insulating layer 102 located between the lower semiconductor layer 104 and the upper semiconductor layer 100. The upper semiconductor layer 100 may have a surface 100*a* and a surface 100*b*, wherein the insulating layer 102 under the surface 100*b* may electrically insulate the upper semiconductor layer 100 from the lower semiconductor layer 104. In one embodiment, a plurality of gaps may be defined in the lower semiconductor layer 104, wherein the gaps divide the lower semiconductor layer 104 into a plurality of portions separated from each other.

In one embodiment, the substrate 20, such as a semiconductor wafer, includes a semiconductor substrate 200, pads 204 disposed on a surface 200*a* of the semiconductor substrate 200 and a dielectric layer 202 disposed on the surface 200*a*. The pads 204 may include a signal pad or a grounding pad.

In one embodiment, the substrate 10 may be bonded onto the substrate 20 such that a portion of the lower semiconductor layer 104 is bonded to and electrically contacts with at least one of the pads 204. In one embodiment, the pads 204 contacting the portion of the lower semiconductor layer 104 may be, but are not limited to grounding pads. In one embodiment, the bonding between the lower semiconductor layer 104 and the pads 204 may be a semiconductor-metal bonding, such as, but not limited to, germanium-aluminum bonding.

Figure 1B:
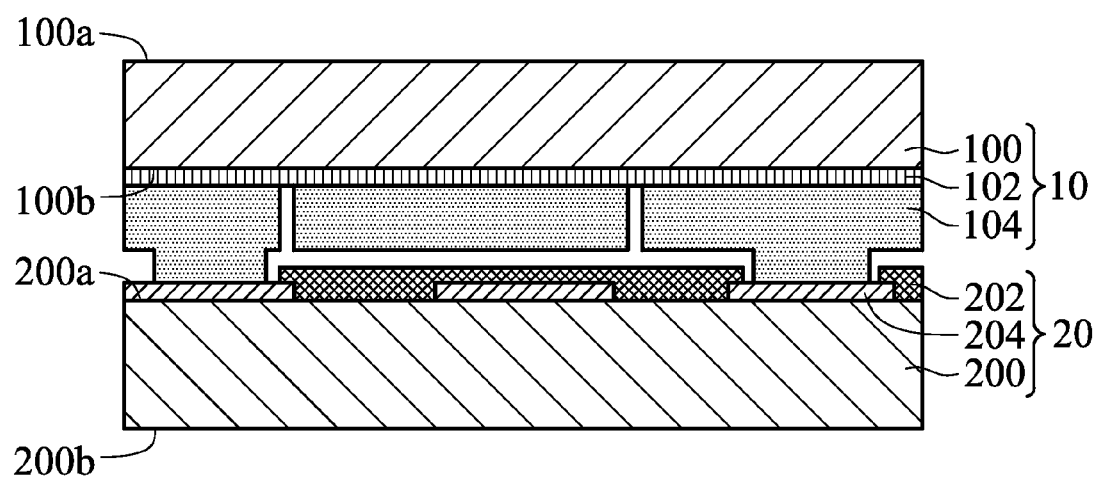

Then, as shown in FIG. 1B, the upper semiconductor layer 100 may be optionally thinned. A suitable thinning process includes, for example, a mechanical polishing process, a chemical mechanical polishing process, an etching process or combinations thereof.

Then, a conducting layer may be formed on the surface 100*a* of the upper semiconductor layer 100, wherein the conducting layer is electrically connected to the portion of the lower semiconductor layer 104 and the pads 204, such as grounding pads. The conducting layer may be electrically connected to the pads 204 via through holes and/or sidewalls of the substrate. However, for the sake of simplicity, the conducting layer in the embodiments described below is electrically connected to the pads 204 (such as grounding pads) via through holes.

Figure 1C:
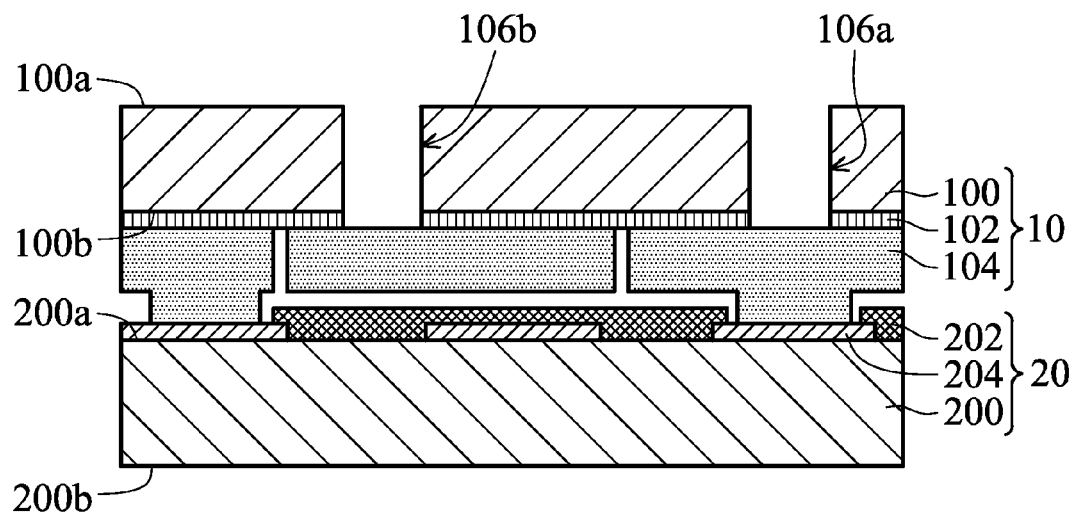

As shown in FIG. 1C, a portion of the upper semiconductor layer 100 and a portion of the insulating layer 102 are removed from the surface 100*a* of the upper semiconductor layer 100 to form a hole 106*a* extending toward the lower semiconductor layer 104. In one embodiment, the hole 106*a* may be aligned with the pad 204 (such as a grounding pad) and the portion of the lower semiconductor layer 104 connecting to the pad 204. In another embodiment, the hole 106*a* may be aligned with the pad 204, but the pad 204, aligned with the hole 106*a*, does not contact the lower semiconductor layer 104. In another embodiment, the hole 106*a* is not aligned with the pad 204.

In one embodiment, a portion of the upper semiconductor layer 100 and a portion of the insulating layer 102 are removed from the surface 100*a* of the upper semiconductor layer 100 to form an opening 106*b* extending toward the lower semiconductor layer 104. The opening 106*b* may expose an upper surface of the lower semiconductor layer 104. In one embodiment, the opening 106*b* and the hole 106*a* may be formed during the same patterning process. In one embodiment, the shape and the distribution of the opening 106*b* are different from that of the hole 106*a*.

Figure 1D:
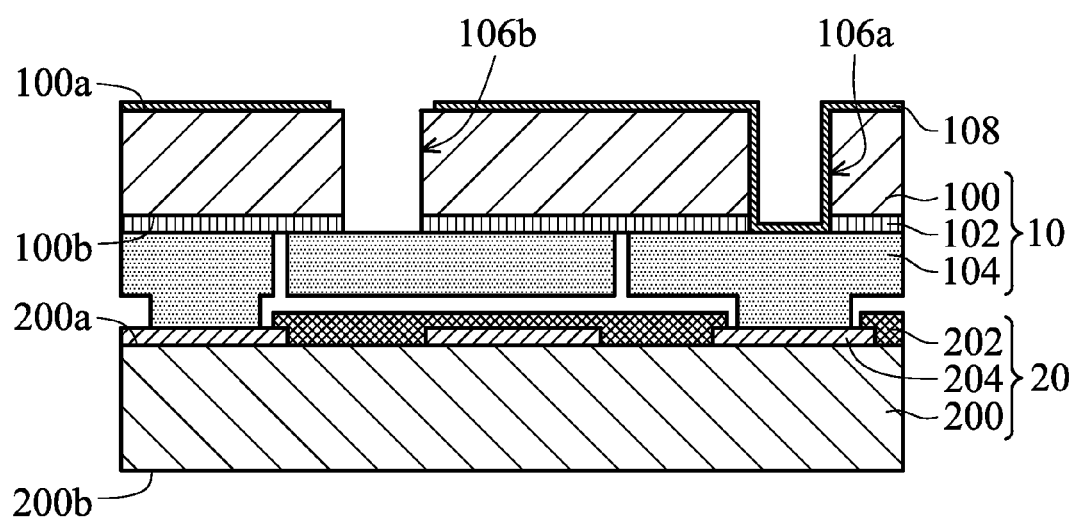

Then, as shown in FIG. 1D, a conducting layer 108 may be formed on the surface 100*a* of the upper semiconductor layer 100. In one embodiment, the conducting layer 108 may extend into the hole 106*a* to electrically contact with the lower semiconductor layer 104 exposed by the hole 106*a*. The lower semiconductor layer 104 exposed by the hole 106*a* may be electrically connected to the pad 204 (such as a grounding pad) on the semiconductor substrate 200. Thus, the conducting layer 108 may be electrically connected to the pad 204 for grounding applications. In one embodiment, the conducting layer 108 may be patterned to not extend into the opening 106*b*. In one embodiment, a side edge of the conducting layer 108, which is the closest to the opening 106*b*, and the opening 106*b* are spaced a distance apart. In one embodiment, the conducting layer 108 may directly contact the upper semiconductor layer 100. In one embodiment, the hole 106*a* may be located on a predetermined scribing line (not shown).

Furthermore, in other embodiments, in addition to grounding applications, the conducting layer 108 may be used as an electromagnetic interference shielding (EMI shielding) layer, a thermal conducting layer or a reflective layer.

Figure 1E:
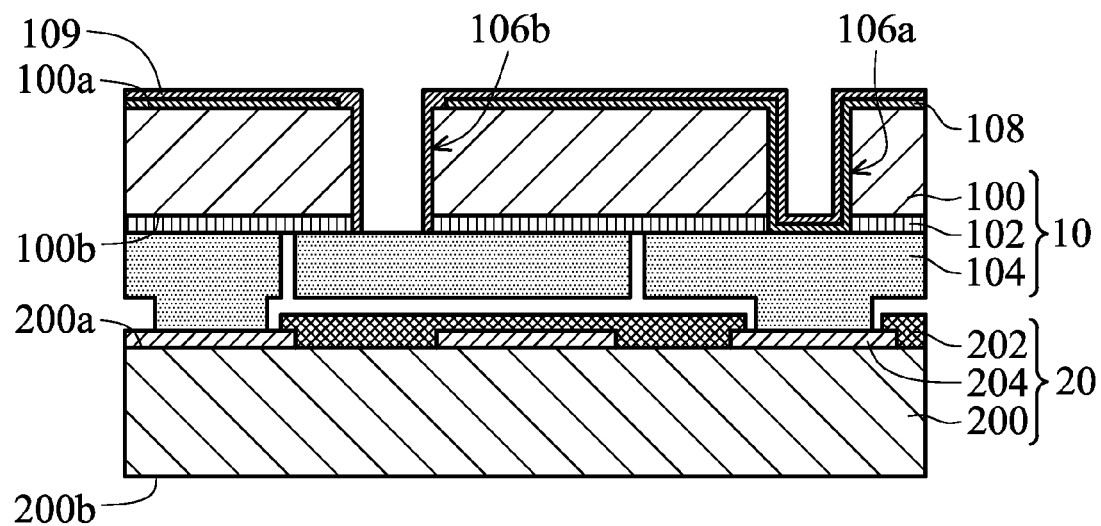

Then, as shown in FIG. 1E, a patterned protection layer 109 may be formed on the upper semiconductor layer 100 and the conducting layer 108. The protection layer 109 may include oxides, nitrides, nitrogen oxides or combinations thereof. In one embodiment, the protection layer 109 may be deposited by using chemical vapor depositions, coating techniques, spraying techniques, or other suitable processes. Then, the protection layer 109 may be patterned by using a photolithography process and an etching process. In one embodiment, the lower semiconductor layer 104 in the opening 106*b* is not covered by the protection layer 109 and thus is exposed. In one embodiment, the protection layer 109 may directly contact the conducting layer 108, the upper semiconductor layer 100 and the insulating layer 102.

Figure 1F:
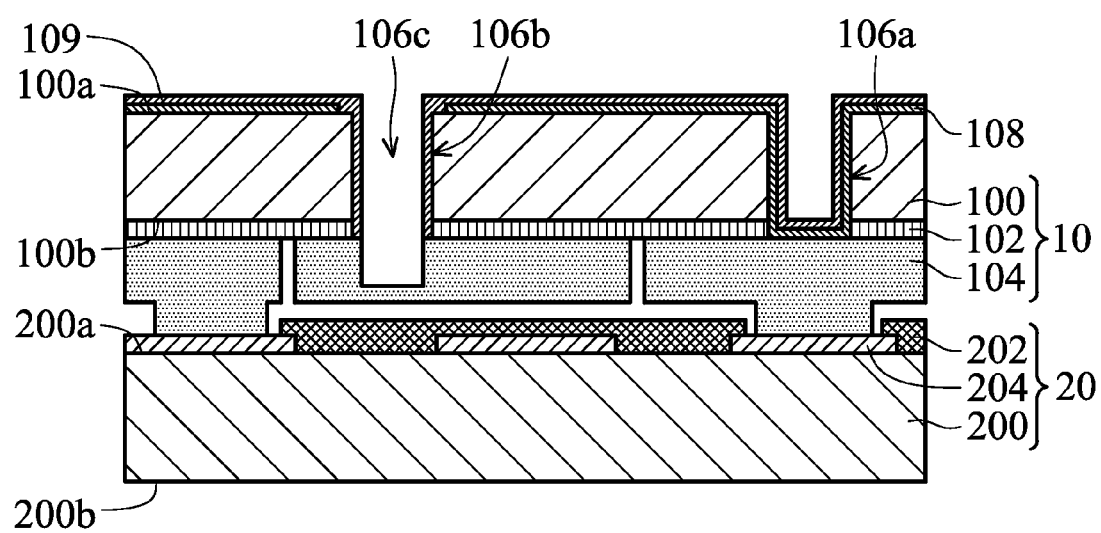

Then, as shown in FIG. 1F, a portion of the lower semiconductor layer 104 is removed from the upper surface of the lower semiconductor layer 104 located in the opening 106*b* by using the protection layer 109 as a mask and thus the opening 106*b* extends into the lower semiconductor layer 104 to become an opening 106*c*. The protection layer 109 may extend onto a portion of the sidewall of the opening 106*c*, wherein the protection layer 109 may, for example, directly contact the upper semiconductor layer 100 and the insulating layer 102 on the sidewall of the opening 106*c*. The lower semiconductor layer 104 located in the opening 106*c* may not be covered by the protection layer 109. In one embodiment, the lower semiconductor layer 104 located at the bottom of the opening 106*c* may be used as, for example, a sensing region, such as, but not limited to, a pressure sensing region or a sound sensing region.

Figure 1G:
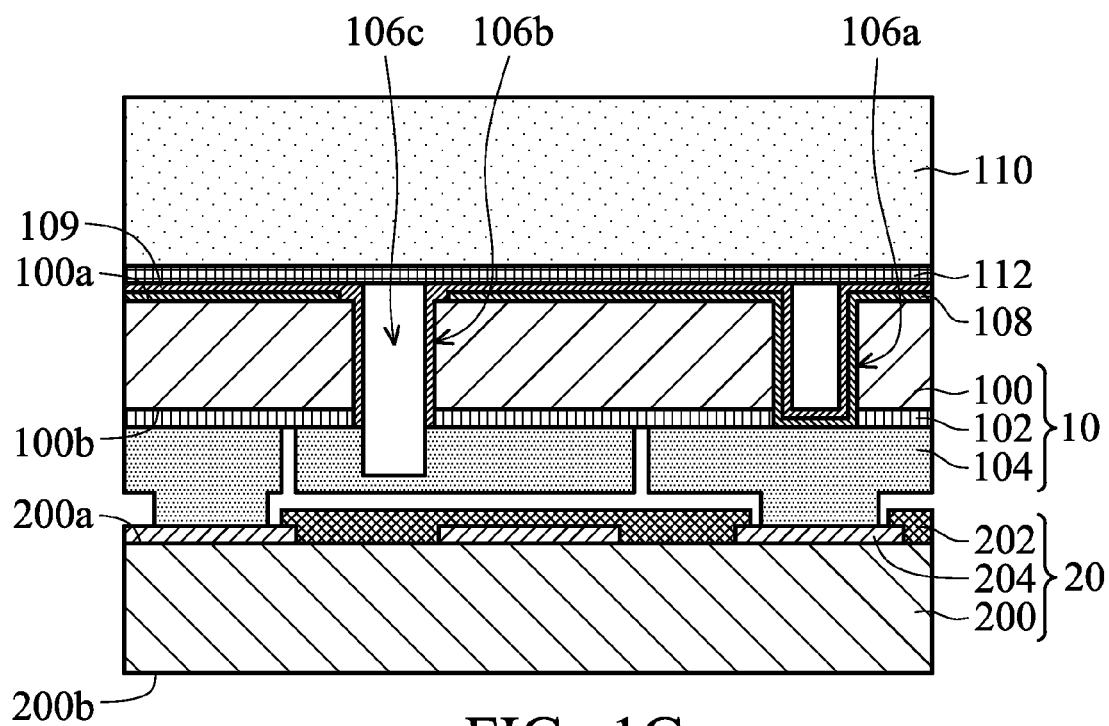

Then, as shown in FIG. 1G, a carrier substrate 110 may be optionally disposed on the upper semiconductor layer 100. For example, an adhesive layer 112 may be adopted to bond the carrier substrate 110 onto the protection layer 109 on the upper semiconductor layer 100. In one embodiment, the adhesive layer 112 may be a temporary adhesive layer, the adhesion of the adhesive layer 112 may be substantially eliminated after being exposed to light, heated or washed.

Figure 1H:
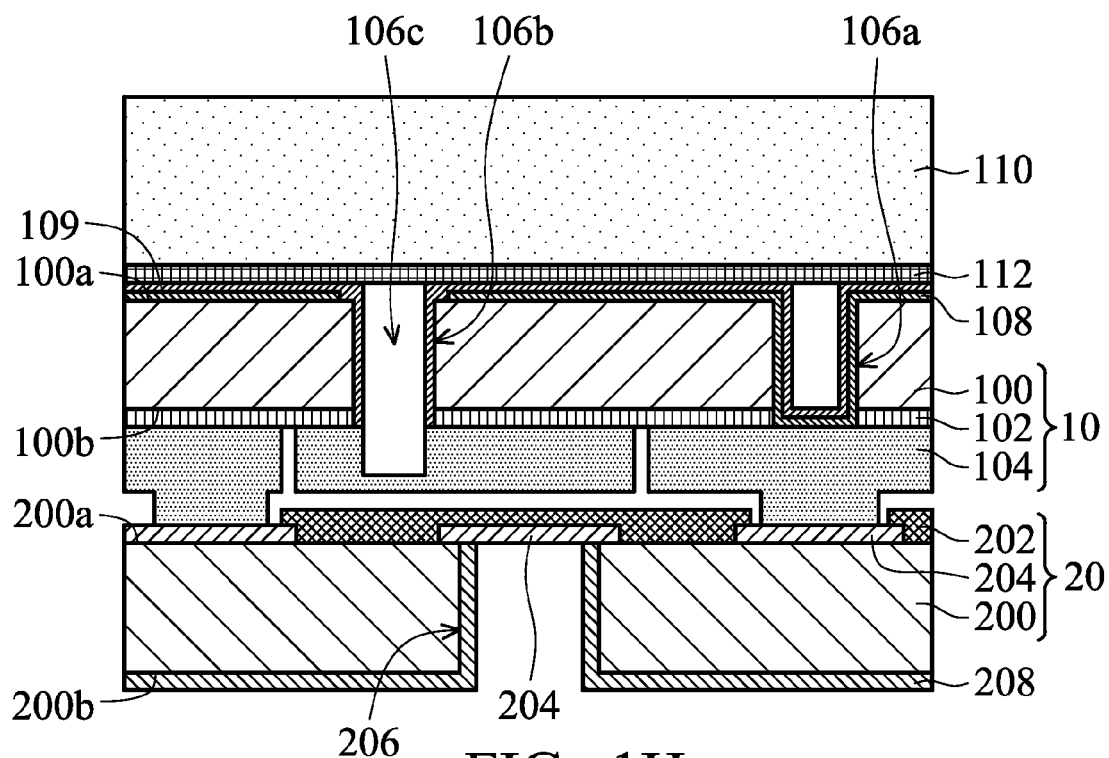

Then, as shown in FIG. 1H, the semiconductor substrate 200 may be optionally thinned. For example, the semiconductor substrate 200 may be thinned from the surface 200b of the semiconductor substrate 200 by using the carrier substrate 110 as a support.

As shown in FIG. 1H, a portion of the semiconductor substrate 200 may be removed from the surface 200b to form a hole 206 extending toward the pad 204, such as a signal pad.

Then, as shown in FIG. 1H, an insulating layer 208 may be formed on the surface 200b of the semiconductor substrate 200. The insulating layer 208 may extend onto the sidewall and the bottom of the hole 206. In one embodiment, the insulating layer 208 located on the bottom of the hole 206 may be removed by a patterning process to expose the pad 204 (e.g. a signal pad).

Figure 1I:
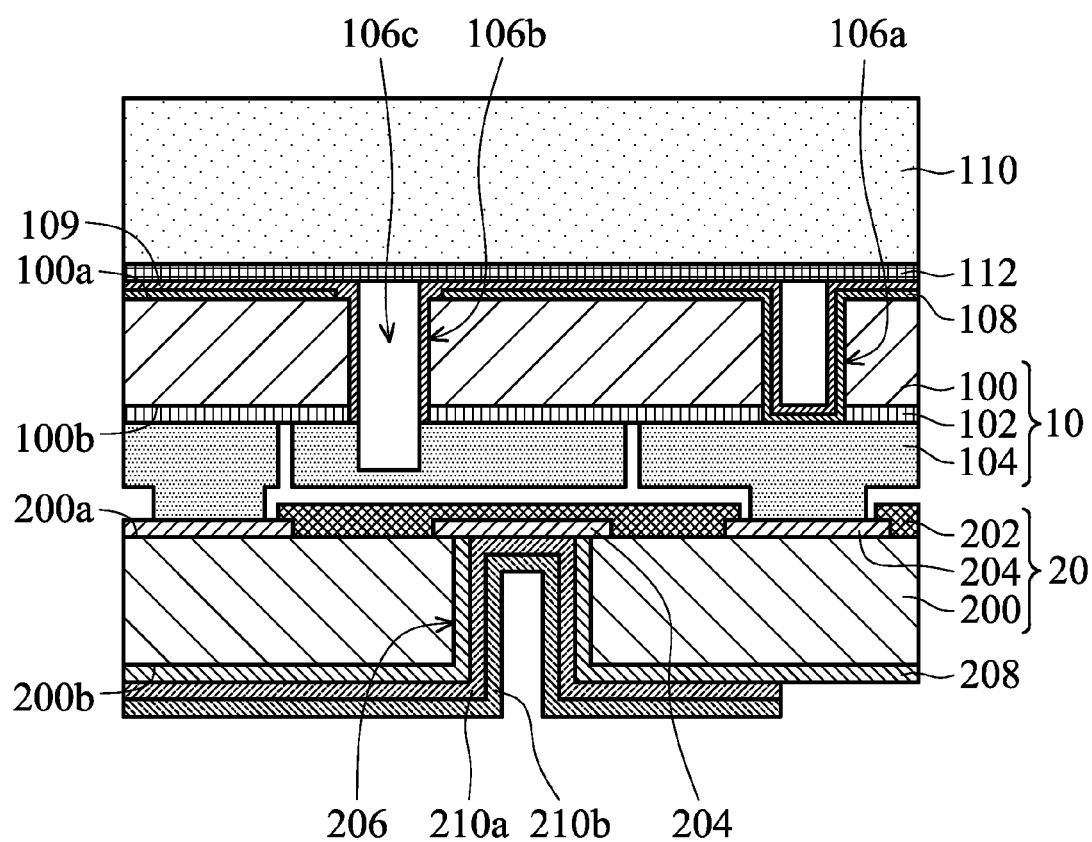

As shown in FIG. 1I, a conducting layer electrically connected to the pad 204 (e.g. a signal pad) is then formed on the insulating layer 208. For example, a seed layer 210a may be formed, and then a conducting layer 210b is formed by an electroplating process.

Figure 1J:
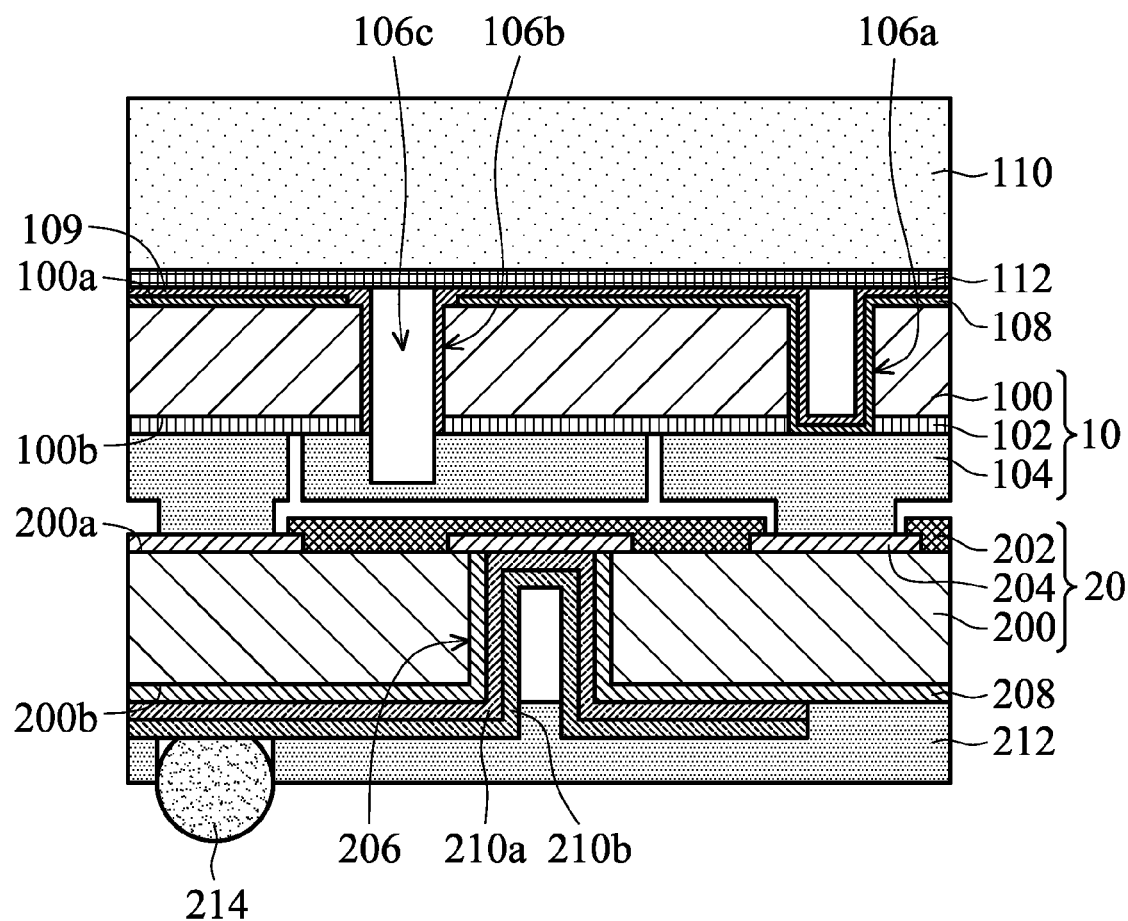

Then, as shown in FIG. 1J, a protection layer 212 may be formed on the conducting layer 210b and the insulating layer 208, and the protection layer 212 has at least one opening exposing a portion of the conducting layer 210b. Then, a signal conducting structure 214 may be formed in the opening, wherein the signal conducting structure 214 is, for example, a conductive bump or a solder ball.

Figure 1K:
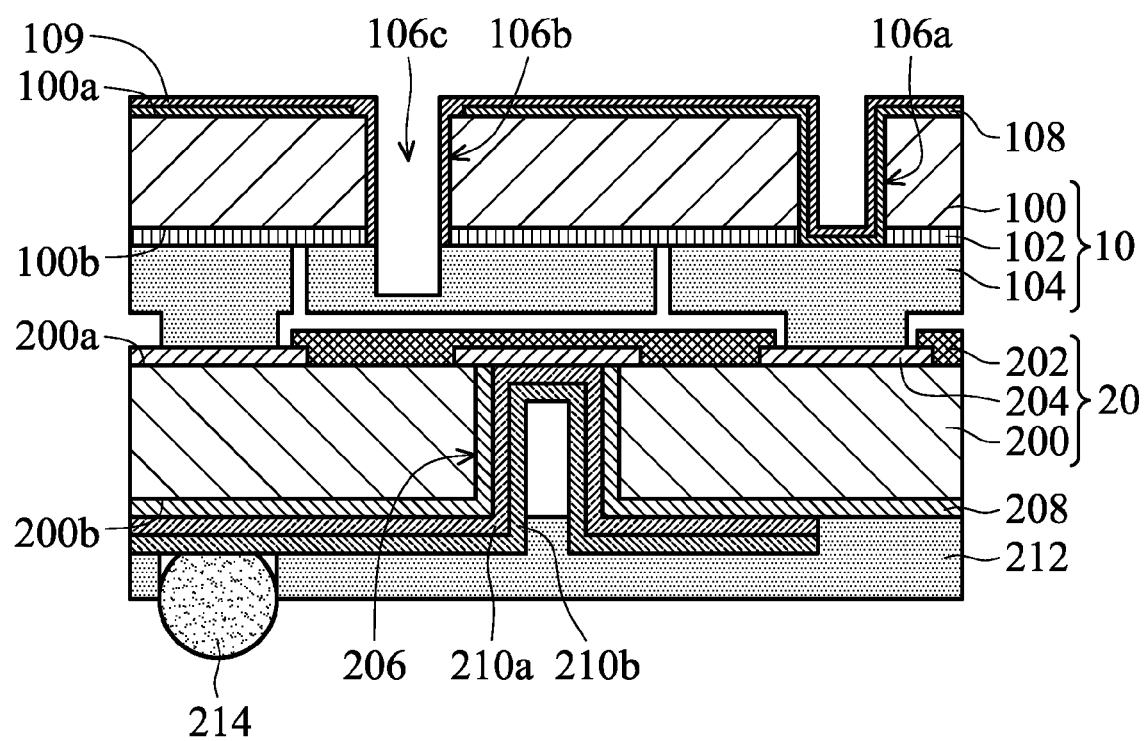

As shown in FIG. 1K, the adhesive layer 112 and the carrier substrate 110 thereon may be then removed. In one embodiment, the adhesive layer 112 and the carrier substrate 110 are removed by exposure to light, heating and/or using solvents. In the embodiment where the two substrates bonded to each other are two semiconductor wafers, a cutting process is performed along the predetermined scribing line (not shown) to cut the two substrates into a plurality of chip packages separated from each other. As shown in FIG. 1K, in one embodiment, the opening 106c may expose a thinner portion of the lower semiconductor layer 104 which may be used as, for example, a sensing region.

Figure 2:
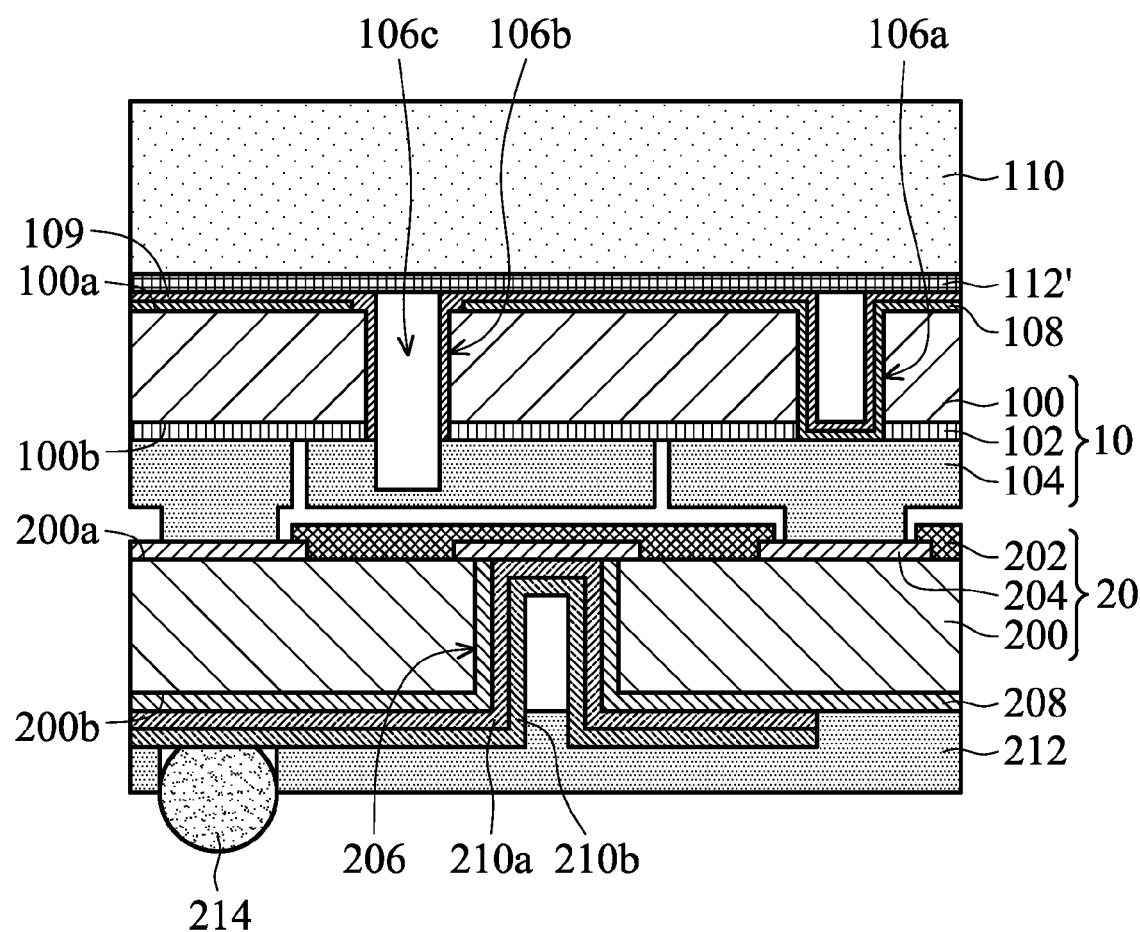
FIG. 2 is a cross-sectional view of a chip package according to an embodiment of the present invention.

FIG. 2 is a cross-sectional view of a chip package according to an embodiment of the present invention, wherein same or similar reference numbers are used to designate same or similar elements. The embodiment of FIG. 2 is substantially the same as the embodiment of FIG. 1, except that the adhesive layer 112' may be, but is not limited to, a permanent adhesive glue. Thus, in the embodiment of FIG. 2, the chip package still has the carrier substrate 110.

In the present embodiment, the signal conducting structure 214 of the chip package may be disposed on the lower surface of the chip package, and the (grounding) pads 204 may be electrically connected to the conducting layer 108 located on the chip package through the lower semiconductor layer 104. Thus, the distribution density of the conductive bumps on the lower surface of the chip package may be reduced. Furthermore, in the present embodiment, the opening may expose the lower semiconductor layer 104 for sensing applications, which may sense, for example, the change of pressure or sounds. The change of pressure or sounds sensed may be converted into electronic signals, and the electronic signals are then transmitted to the substrate 20 to be processed and are conducted out of the chip package for applications.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package, comprising:
a first substrate;
a second substrate disposed on the first substrate, wherein the second substrate comprises a lower semiconductor layer, an upper semiconductor layer, and an insulating layer therebetween, and a portion of the lower semiconductor layer electrically contacts with at least one pad on the first substrate;
a conducting layer disposed on the upper semiconductor layer of the second substrate and electrically connected to the portion of the lower semiconductor layer electrically contacting with the at least one pad;
an opening extending from the upper semiconductor layer towards the lower semiconductor layer and extending into the lower semiconductor layer; and
a protection layer disposed on the upper semiconductor layer and the conducting layer, wherein the protection layer extends onto a portion of a sidewall of the opening, and does not cover the lower semiconductor layer in the opening.

2. The chip package as claimed in claim 1, further comprising:
a signal conducting structure disposed on a lower surface of the first substrate, wherein the signal conducting structure is electrically connected to a signal pad on the first substrate.

3. The chip package as claimed in claim 2, further comprising:
a second conducting layer electrically connected to the signal conducting structure and the signal pad.

4. The chip package as claimed in claim 3, further comprising:
a hole extending from a lower surface of the first substrate to the signal pad, wherein the second conducting layer extends into the hole to electrically contact with the signal pad, and a second insulating layer separates the second conducting layer from the first substrate.

5. The chip package as claimed in claim 1, wherein a side edge of the conducting layer, which is the closest to the opening, and the opening are spaced a distance apart.

6. The chip package as claimed in claim 1, further comprising:
a second hole extending from an upper surface of the upper semiconductor layer of the second substrate to the lower semiconductor layer of the second substrate, wherein the conducting layer extends into the second hole to electrically contact with the portion of the lower semiconductor layer.

7. The chip package as claimed in claim 6, wherein the second hole is aligned with one of the at least one pad.

8. The chip package as claimed in claim 1, wherein the conducting layer directly contacts with the second substrate.

9. The chip package as claimed in claim 1, wherein the protection layer directly contacts with the conducting layer, the upper semiconductor layer and the insulating layer.

10. The chip package as claimed in claim 1, further comprising:
a carrier substrate disposed on the second substrate.

11. A method for forming a chip package, comprising:
providing a first substrate;
providing a second substrate comprising a lower semiconductor layer, an upper semiconductor layer, and an insulating layer therebetween;
bonding the second substrate onto the first substrate such that a portion of the lower semiconductor layer electrically contacts with at least one pad on the first substrate;
removing a portion of the upper semiconductor layer and a portion of the insulating layer to form an opening exposing an upper surface of the lower semiconductor layer;
forming a conducting layer on the upper semiconductor layer of the second substrate, wherein the conducting layer is electrically connected to the portion of the lower semiconductor layer electrically contacting with the at least one pad;
forming a protection layer on the upper semiconductor layer and the conducting layer, wherein the protection layer extends onto a sidewall of the opening, and does not cover a portion of the upper surface of the lower semiconductor layer in the opening; and
removing a portion of the lower semiconductor layer from the upper surface of the lower semiconductor layer in the opening by using the protection layer as a mask, and thus the opening extends into the lower semiconductor layer.

12. The method for forming the chip package as claimed in claim 11, further comprising:
disposing a signal conducting structure on a lower surface of the first substrate, wherein the signal conducting structure is electrically connected to a signal pad on the first substrate.

13. The method for forming the chip package as claimed in claim 12, further comprising:
removing a portion of the first substrate from a lower surface of the first substrate to form a hole exposing the signal pad;
forming a second insulating layer on the lower surface of the first substrate and a sidewall of the second hole;
forming a second conducting layer on the lower surface of the first substrate, wherein the second conducting layer extends into the hole to electrically connect with the signal pad; and
forming the signal conducting structure on the second conducting layer on the lower surface of the first substrate.

14. The method for forming the chip package as claimed in claim 11, further comprising:
before forming the conducting layer, removing a portion of the upper semiconductor layer to form a second hole extending toward the lower semiconductor layer, and then forming the conducting layer extending into the second hole to electrically contact with the portion of the lower semiconductor layer.

15. The method for forming the chip package as claimed in claim 14, wherein the hole and the second opening are formed simultaneously.

16. The method for forming the chip package as claimed in claim 14, wherein the conducting layer substantially covers a sidewall and a bottom of the hole completely.

17. The method for forming the chip package as claimed in claim 11, further comprising:
bonding a carrier substrate onto the second substrate.

18. The method for forming the chip package as claimed in claim 17, further comprising:
removing the carrier substrate.

19. The method for forming the chip package as claimed in claim 11, wherein the protection layer directly contacts with the conducting layer, the upper semiconductor layer and the insulating layer.

20. The method for forming the chip package as claimed in claim 11, further comprising:
performing a cutting process on the first substrate and the second substrate to form a plurality of chip packages separated from each other.

* * * * *